United States Patent
Shen et al.

(10) Patent No.: US 8,341,492 B2
(45) Date of Patent: Dec. 25, 2012

(54) QUASI-CYCLIC LDPC (LOW DENSITY PARITY CHECK) CODE CONSTRUCTION

(75) Inventors: Ba-Zhong Shen, Irvine, CA (US); Tak K. Lee, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 789 days.

(21) Appl. No.: 12/508,459

(22) Filed: Jul. 23, 2009

(65) Prior Publication Data

US 2010/0023838 A1    Jan. 28, 2010

Related U.S. Application Data

(60) Provisional application No. 61/084,144, filed on Jul. 28, 2008.

(51) Int. Cl.
*H03M 13/00* (2006.01)
(52) U.S. Cl. .................................................. 714/758
(58) Field of Classification Search .......... 714/752–758, 714/774, 786, 791, 794–796
See application file for complete search history.

(56) References Cited

U.S. PATENT DOCUMENTS

| | | | | |
|---|---|---|---|---|
| 7,222,289 | B2 * | 5/2007 | Hung | 714/807 |
| 7,617,439 | B2 * | 11/2009 | Shen et al. | 714/784 |
| 2004/0093554 | A1 * | 5/2004 | Hung | 714/801 |
| 2006/0195754 | A1 * | 8/2006 | Shen et al. | 714/752 |
| 2009/0013237 | A1 * | 1/2009 | Lin et al. | 714/758 |

OTHER PUBLICATIONS

R. Gallager, Low-Density Parity-Check Codes, Cambridge, MA: MIT Press, 1963.
R. G. Gallager, "Low density parity check codes," IRE Trans. Info. Theory, vol. IT-8, Jan. 1962, pp. 21-28.
M. G. Luby, M. Mitzenmacher, M. A. Shokrollahi, D. A. Spielman, and V. Stemann, "Practical Loss-Resilient Codes", Proc. 29th Symp. on Theory of Computing, 1997, pp. 150-159.
T. J. Richardson and R. L. Urbanke, "The capacity of low-density parity-check code under message-passing decoding," IEEE Trans. Inform. Theory, vol. 47, No. 2, Feb. 2001, pp. 599-618.
Marc P. C. Fossorier, "Quasi-Cyclic Low-Density Parity-Check Codes From Circulant Permutation Matrices," IEEE Trans. Inform. Theory, vol. 50, No. 8, Aug. 2004, pp. 1788-1793.

* cited by examiner

*Primary Examiner* — Nadeem Iqbal
(74) *Attorney, Agent, or Firm* — Garlick & Markison; Shayne X. Short

(57) ABSTRACT

Quasi-cyclic LDPC (Low Density Parity Check) code construction is presented that ensures no four cycles therein (e.g., in the bipartite graphs corresponding to the LDPC codes). Each LDPC code has a corresponding LDPC matrix that is composed of square sub-matrices, and based on the size of the sub-matrices of a particular LDPC matrix, then sub-matrix-based cyclic shifting is performed as not only a function of sub-matrix size, but also the row and column indices, to generate CSI (Cyclic Shifted Identity) sub-matrices. When the sub-matrix size is prime (e.g., each sub-matrix being size q×q, where q is a prime number), then it is guaranteed that no four cycles will exist in the resulting bipartite graph corresponding to the LDPC code of that LDPC matrix. When q is a non-prime number, an avoidance set can be used and/or one or more sub-matrices can be made to be an all zero-valued sub-matrix.

20 Claims, 12 Drawing Sheets

$$H = \begin{bmatrix} h_{0,0} & h_{0,1} & \cdots & h_{0,n-1} \\ h_{1,0} & h_{1,1} & \cdots & h_{1,n-1} \\ \vdots & \vdots & \ddots & \vdots \\ h_{m-1,0} & h_{m-1,1} & \cdots & h_{m-1,n-1} \end{bmatrix}$$

$\Rightarrow$ $$H = \begin{bmatrix} S_{0,0} & S_{0,1} & S_{0,2} & \cdots & S_{0,N-1} \\ S_{1,0} & S_{1,1} & S_{1,2} & \cdots & S_{1,N-1} \\ \vdots & \vdots & \vdots & \ddots & \vdots \\ S_{M-1,0} & S_{M-1,1} & S_{M-1,2} & \cdots & S_{M-1,N-1} \end{bmatrix}$$

each $S_{x,y}$ is $q \times q$ $M = m/q$
$N = n/q$

NOTE: each $S_{x,y}$ =
(a) all zero-valued sub-matrix; or
(b) CSI sub-matrix

QUASI-CYCLIC LDPC (LOW DENSITY PARITY CHECK) CODE CONSTRUCTION

CROSS REFERENCE TO RELATED PATENTS/PATENT APPLICATIONS

Provisional Priority Claims

The present U.S. Utility patent application claims priority pursuant to 35 U.S.C. §119(e) to the following U.S. Provisional Patent Application which is hereby incorporated herein by reference in its entirety and made part of the present U.S. Utility Patent Application for all purposes:

1. U.S. Provisional Application Ser. No. 61/084,144, entitled "Quasi-cyclic LDPC (Low Density Parity Check) code construction," filed Jul. 28, 2008, pending.

Incorporation by Reference

The following U.S. Utility patent applications are hereby incorporated herein by reference in their entirety and made part of the present U.S. Utility patent application for all purposes:

1. U.S. Utility patent application Ser. No. 11/472,226, entitled "Efficient construction of LDPC (Low Density Parity Check) codes with corresponding parity check matrix having CSI (Cyclic Shifted Identity) sub-matrices,", filed on Jun. 21, 2006, pending.

2. U.S. Utility patent application Ser. No. 11/472,256, entitled "Efficient construction of LDPC (Low Density Parity Check) codes with corresponding parity check matrix having CSI (Cyclic Shifted Identity) sub-matrices,", filed on Jun. 21, 2006, pending.

Both of these U.S. Utility patent applications incorporated by reference above claim priority pursuant to 35 U.S.C. §119(e) to the following U.S. Provisional Patent Applications which are hereby incorporated herein by reference in their entirety and made part of the present U.S. Utility patent application for all purposes:

a. U.S. Provisional Application Ser. No. 60/700,127, entitled "Algebraic construction of LDPC (Low Density Parity Check) codes with corresponding parity check matrix having CSI (Cyclic Shifted Identity) sub-matrices,", filed Jul. 18, 2005, now expired.

b. U.S. Provisional Application Ser. No. 60/708,937, entitled "Algebraic construction of LDPC (Low Density Parity Check) codes with corresponding parity check matrix having CSI (Cyclic Shifted Identity) sub-matrices,", filed Aug. 17, 2005, now expired.

c. U.S. Provisional Application Ser. No. 60/716,868, entitled "Algebraic construction of LDPC (Low Density Parity Check) codes with corresponding parity check matrix having CSI (Cyclic Shifted Identity) sub-matrices,", filed Sep. 14, 2005, now expired.

d. U.S. Provisional Application Ser. No. 60/721,599, entitled "Algebraic construction of LDPC (Low Density Parity Check) codes with corresponding parity check matrix having CSI (Cyclic Shifted Identity) sub-matrices,", filed Sep. 29, 2005, now expired.

e. U.S. Provisional Application Ser. No. 60/728,250, entitled "Efficient construction of LDPC (Low Density Parity Check) codes with corresponding parity check matrix having CSI (Cyclic Shifted Identity) sub-matrices,", filed Oct. 19, 2005, now expired.

BACKGROUND OF THE INVENTION

1. Technical Field of the Invention

The invention relates generally to means for generating coding for use in communication systems; and, more particularly, it relates to means for generating LDPC (Low Density Parity Check) matrices and corresponding LDPC codes for use in accordance with encoding and/or decoding of signals within such communication systems.

2. Description of Related Art

Data communication systems have been under continual development for many years. One such type of communication system that has been of significant interest lately is a communication system that employs iterative error correction codes (ECCs). Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code with a length of one million, it nevertheless demonstrates the very promising application of LDPC codes within communication systems.

The use of LDPC coded signals continues to be explored within many newer application areas. Some examples of possible communication systems that may employ LDPC coded signals include communication systems employing 4 wire twisted pair cables for high speed Ethernet applications (e.g., 10 Gbps (Giga-bits per second) Ethernet operation according to the IEEE 802.3an (10 GBASE-T) emerging standard) as well as communication systems operating within a wireless context (e.g., in the IEEE 802.11 context space including the IEEE 802.11n emerging standard).

For any of these particular communication system application areas, near-capacity achieving error correction codes are very desirable. The latency constraints, which would be involved by using traditional concatenated codes, simply preclude their use in such applications in very high data rate communication system application areas.

Generally speaking, within the context of communication systems that employ LDPC codes, there is a first communication device at one end of a communication channel with encoder capability and second communication device at the other end of the communication channel with decoder capability. In many instances, one or both of these two communication devices includes encoder and decoder capability (e.g., within a bi-directional communication system). LDPC codes can be applied in a variety of additional applications as well, including those that employ some form of data storage (e.g., hard disk drive (HDD) applications and other memory storage devices) in which data is encoded before writing to the storage media, and then the data is decoded after being read/retrieved from the storage media.

The design of LDPC codes for use in various communication systems or devices continues to be a challenge. Oftentimes, a brute force/trial and error approach is used in which a designer simply tries various parity check matrices to try to find one that provides sufficient performance. As the use of LDPC codes expands evermore and a need for different parity check matrices having different properties grows, the art has failed to provide an adequate means by which various LDPC codes may be designed and compared efficiently.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 6 illustrates an embodiment of the relationship between an overall LDPC matrix and the individual sub-matrices therein that include all zero-valued sub-matrices and/or CSI (Cyclic Shifted Identity) sub-matrices.

FIG. 10 illustrates an embodiment of a method for construction of multiple LDPC codes and performing comparison thereof to select at least one LDPC code there from.

DETAILED DESCRIPTION OF THE INVENTION

Communication systems have been around for some time, and their presence into modern life is virtually ubiquitous (e.g., from television communication systems, telecommunication systems including wired and wireless communication systems, etc.). As these communication systems continue to be developed, there is an ever present need for designing various means by which information may be encoded for transmitting from a first location to a second location. In accordance with this, error correction codes (ECCs) are a critical component in ensuring that the information received at the second location is actually the information sent from the first location. LDPC (Low Density Parity Check) codes are one such type of ECC that can be employed within any of a variety of communication systems.

It is noted that any of the following embodiments and approaches described herein are applicable regardless of any overall LDPC decoder architecture which may be employed, e.g., whether fully parallel, partially parallel, or serial in a particular architecture/hardware implementation.

Figure 1:
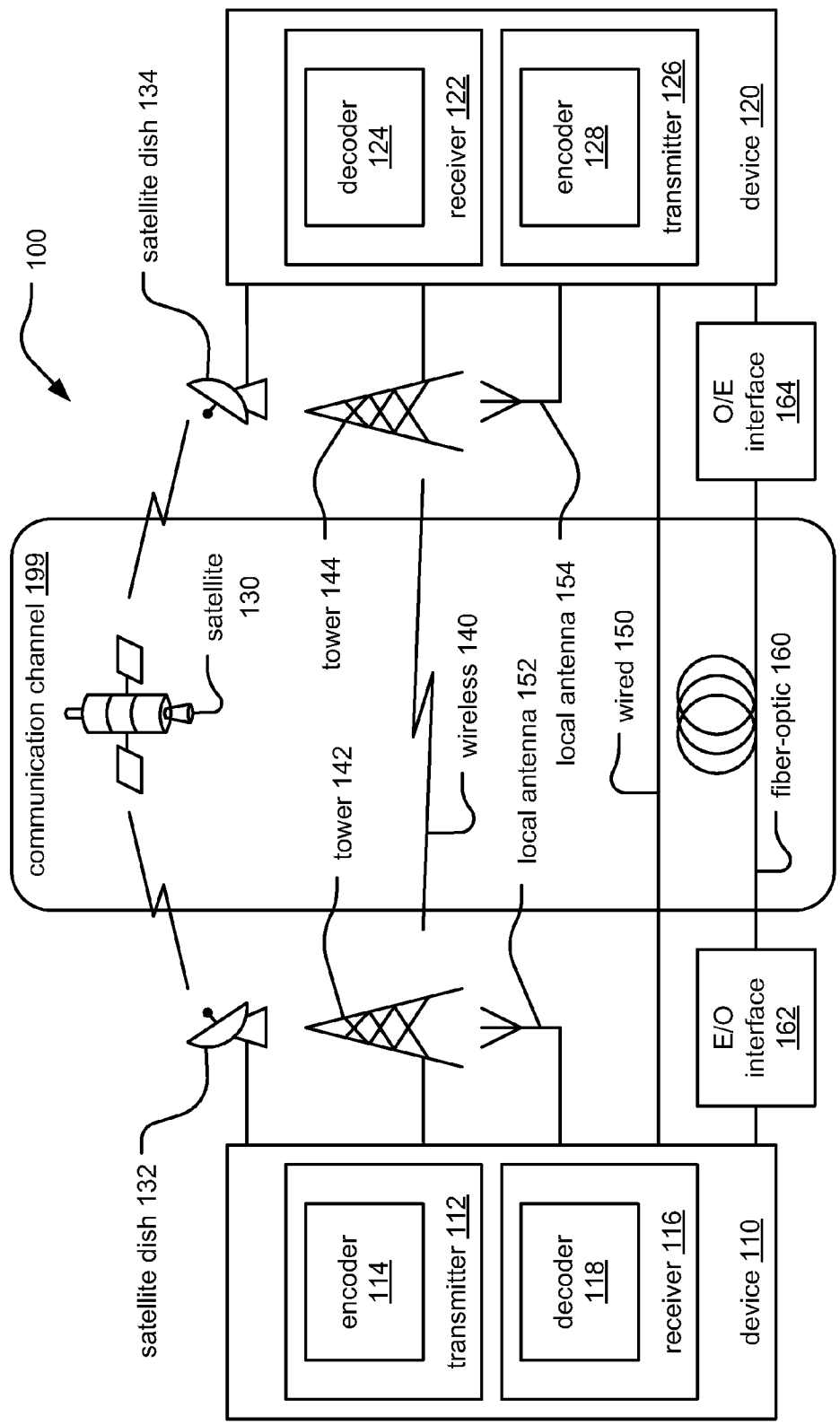
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
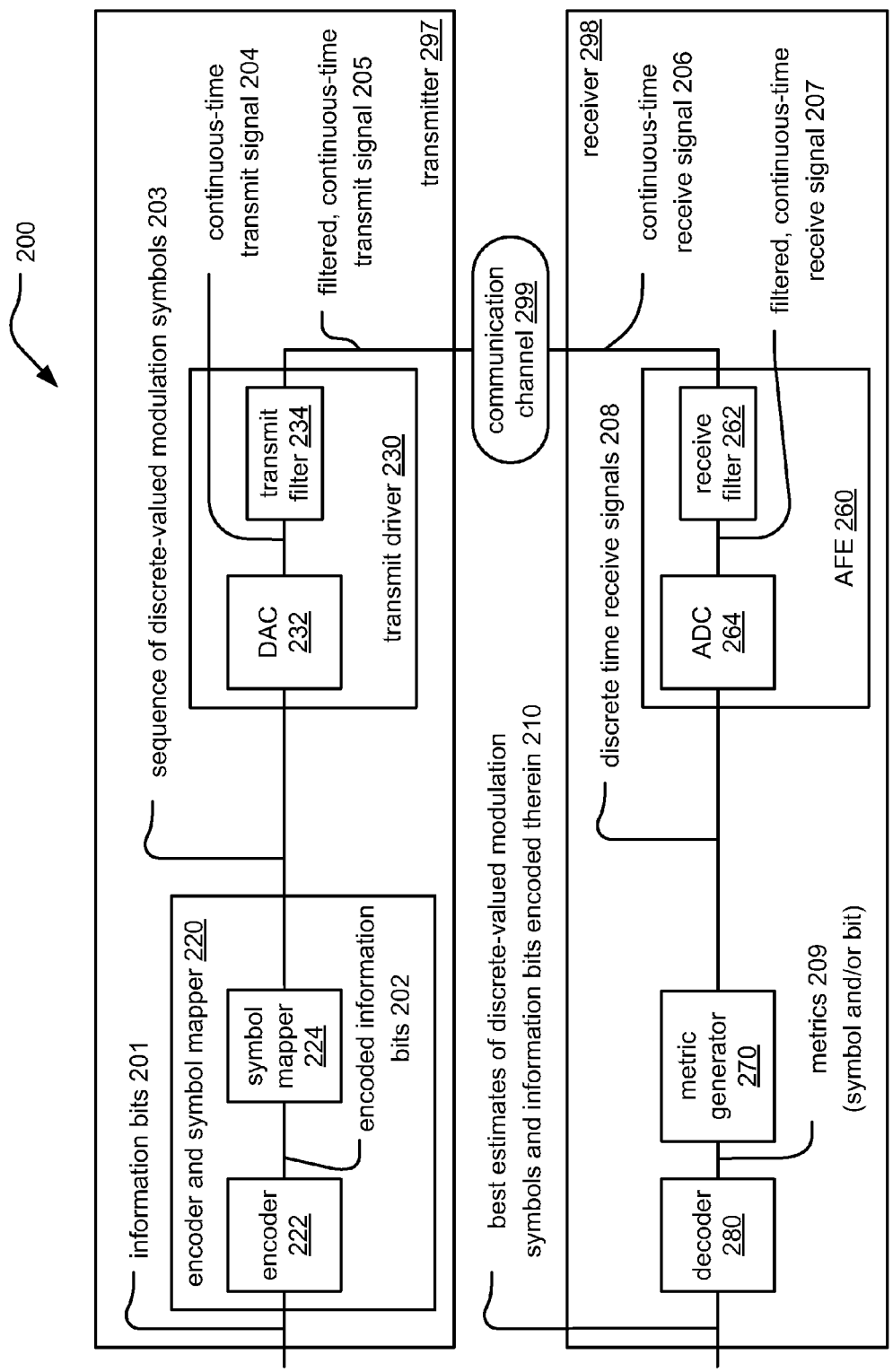

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Any of the various types of LDPC codes described herein can be employed within any such desired communication system (e.g., including those variations described with respect to FIG. 1), any information storage device (e.g., hard disk drives (HDDs), network information storage devices and/or servers, etc.) or any application in which information encoding and/or decoding is desired.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299.

At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates metrics 209 (e.g., on either a symbol and/or bit basis) that are employed by a decoder 280 to make best estimates of the discrete-valued modulation symbols and information bits encoded therein 210.

The decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. Before more details are provided below, a general description of LDPC codes is provided.

Figure 3:
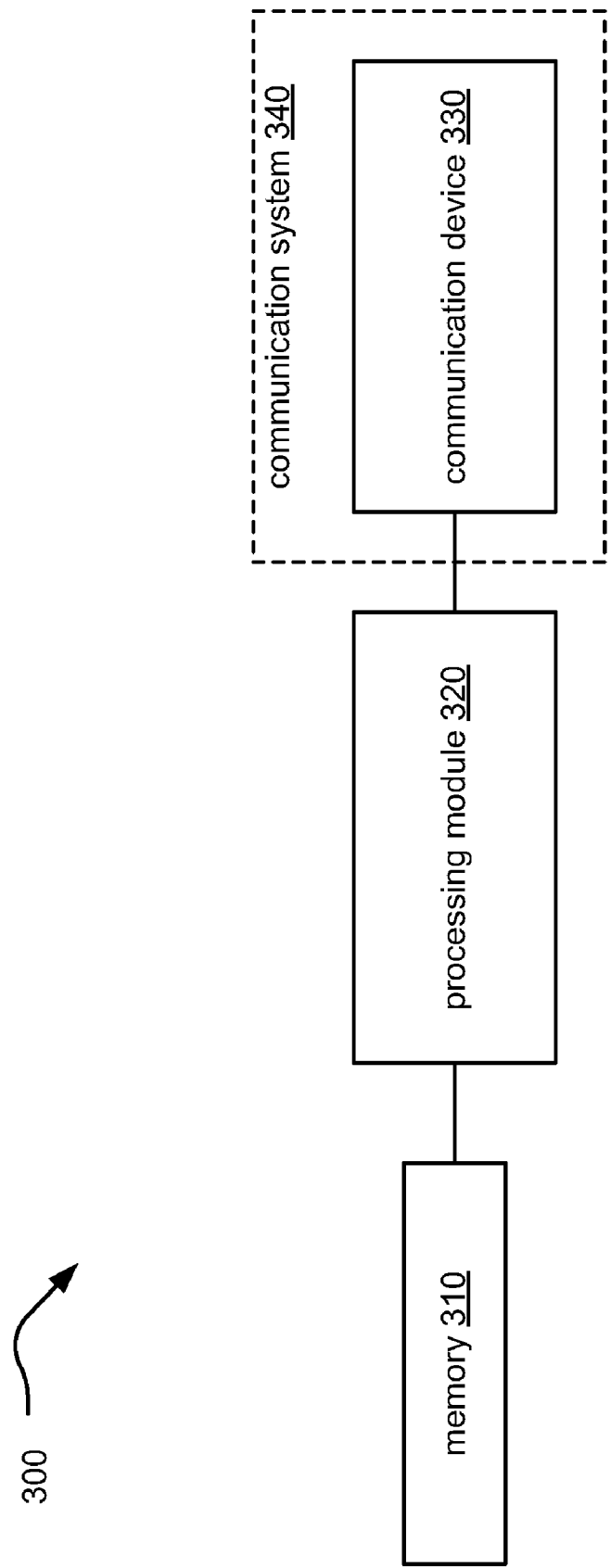
FIG. 3 illustrates an embodiment of an apparatus that is operable to perform LDPC decoding processing and/or LDPC code construction.

FIG. 3 illustrates an embodiment of an apparatus 300 that is operable to perform LDPC decoding processing and/or LDPC code construction. The apparatus 300 includes a processing module 320, and a memory 310. The memory 310 is coupled to the processing module, and the memory 310 is operable to store operational instructions that enable the processing module 320 to perform a variety of functions. The processing module 320 is operable to perform and/or direct the manner in which various LDPC codes may be constructed in accordance with any embodiment described herein, or any equivalent thereof.

The processing module 320 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 310 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 320 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the manner in which LDPC code construction is to be performed (e.g., the size of sub-matrices within the LDPC matrix of a corresponding LDPC code, the number of all-zero-valued sub-matrices, the cyclic shift (if any) of any sub-matrix within an LDPC matrix, etc.) can be provided from the apparatus 300 to a communication system 340 that is operable to employ and perform LDPC coding using a desired LDPC code. For example, information corresponding to the LDPC code being used (e.g., the parity check matrix of the LDPC code) can also be provided from the processing module 320 to any of a variety of communication devices 330 implemented within any desired such communication system 340 as well.

If desired, the apparatus 320 can be designed to generate multiple means of constructing LDPC codes in accordance with multiple needs and/or desires as well. In some embodiments, the processing module 320 can selectively provide different information (e.g., corresponding to different LDPC codes and their corresponding LDPC matrices, relative performance comparison between the various LDPC codes, etc.) to different communication devices and/or communication systems. That way, different communication links between different communication devices can employ different LDPC codes and/or means by which to perform LDPC encoding and/or decoding. Clearly, the processing module 320 can also provide the same information to each of different communication devices and/or communication systems as well without departing from the scope and spirit of the invention.

Figure 4:
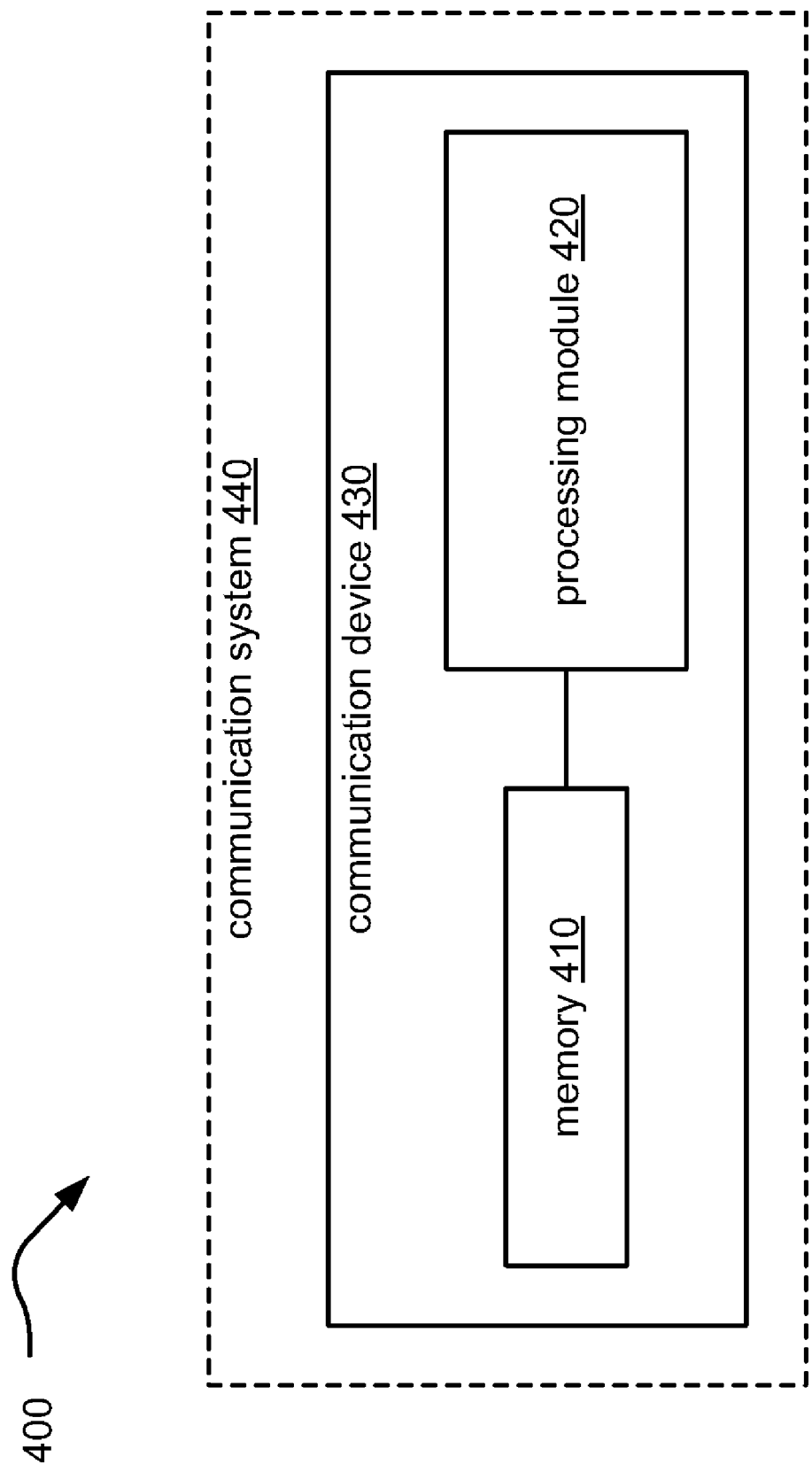
FIG. 4 illustrates an alternative embodiment of an apparatus that is operable to perform LDPC decoding processing and/or LDPC code construction.

FIG. 4 illustrates an alternative embodiment of an apparatus that is operable to perform LDPC decoding processing and/or LDPC code construction. The apparatus 400 includes a processing module 420, and a memory 410. The memory 410 is coupled to the processing module, and the memory 410 is operable to store operational instructions that enable the processing module 420 to perform a variety of functions. The processing module 420 (serviced by the memory 420) can be implemented as an apparatus capable to perform any of the functionality of any of the various modules and/or functional blocks described herein. For example, the processing module 420 (serviced by the memory 420) can be implemented as an apparatus capable to perform and/or direct the manner in which LDPC code construction is to be performed in accordance with any embodiment described herein, or any equivalent thereof.

The processing module 420 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 410 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 420 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 400 can be any of a variety of communication devices 430, or any part or portion of any such communication device 430. Any such communication device that includes the processing module 420 and/or memory 410 can be implemented within any of a variety of communication systems 440 as well. It is also noted that various embodiments of LDPC decoding processing in accordance with LDPC decoding processing as presented herein, and equivalents thereof, may be applied to many types of communication systems and/or communication devices.

Figure 5:
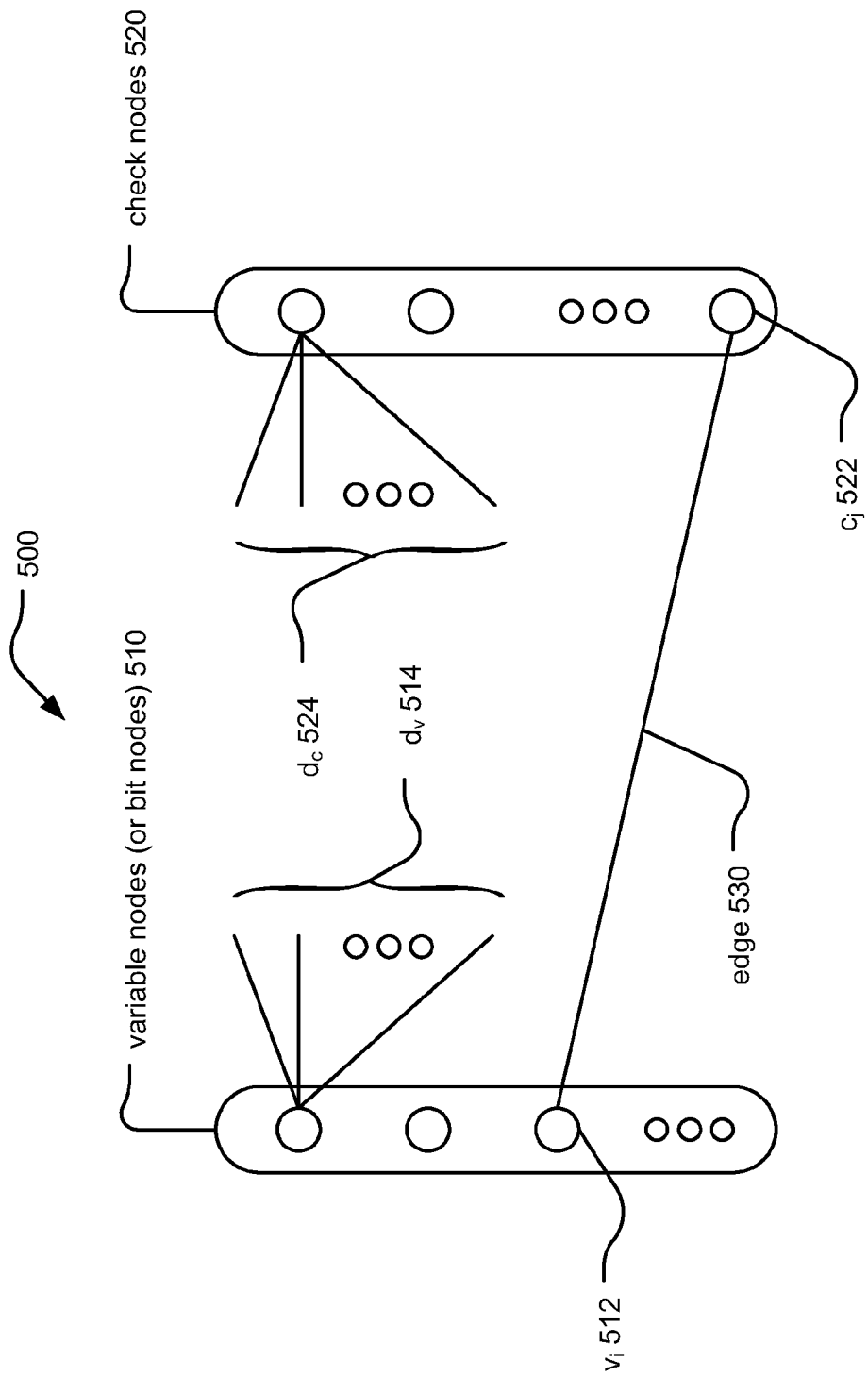
FIG. 5 illustrates an embodiment of an LDPC (Low Density Parity Check) code bipartite graph.

FIG. 5 illustrates an embodiment of an LDPC (Low Density Parity Check) code bipartite graph 500. In the art, an LDPC bipartite graph may also sometimes be referred to as a "Tanner" graph. An LDPC code may be viewed as being a code having a binary parity check matrix such that nearly all of the elements of the matrix have values of zeroes (e.g., the binary parity check matrix is sparse). For example, $H=(h_{i,j})_{M \times N}$ may be viewed as being a parity check matrix of an LDPC code with block length N.

LDPC codes are linear block codes and hence the set of all codewords $x \in C$ spans the null space of a parity check matrix, H.

$$Hx^T = 0, \forall x \in C \quad (1)$$

For LDPC codes, H, is a sparse binary matrix of dimension m×n. Each row of H corresponds to a parity check and a set element $h_{i,j}$ indicates that data symbol j participates in parity check i. Each column of H corresponds to a codeword symbol.

For each codeword x there are n symbols of which m are parity symbols. Hence the code rate r is given by:

$$r = (n-m)/n \quad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v, d_c)$ regular LDPC code, otherwise the LDPC code is called an irregular LDPC code.

LDPC codes were introduced by R. Gallager in [1] referenced below (also in [2] referenced below) and by M. Luby et al. in [3] also referenced below.

[1] R. Gallager, *Low-Density Parity-Check Codes*, Cambridge, Mass.: MIT Press, 1963.

[2] R. G. Gallager, "Low density parity check codes," *IRE Trans. Info. Theory*, vol. IT-8, January 1962, pp. 21-28.

[3] M. G. Luby, M. Mitzenmacher, M. A. Shokrollahi, D. A. Spielman, and V. Stemann, "Practical Loss-Resilient Codes", *Proc. 29$^{th}$ Symp. on Theory of Computing*, 1997, pp. 150-159.

A regular LDPC code can be represented as a bipartite graph 500 by its parity check matrix with left side nodes representing variable of the code bits (or alternatively as the "variable nodes" (or "bit nodes") 510 in a bit decoding approach to decoding LDPC coded signals), and the right side nodes representing check equations (or alternatively as the "check nodes" 520). The bipartite graph 500 (or sometimes referred to as a Tanner graph 500) of the LDPC code defined by H may be defined by N variable nodes (e.g., N bit nodes) and M check nodes. Every variable node of the N variable nodes 510 has exactly $d_v(i)$ edges (an example edge shown using reference numeral 530) connecting the bit node, $v_i$ 512, to one or more of the check nodes (within the M check nodes). The edge 530 is specifically shown as connecting from the bit node, $v_i$ 512, to the check node, $c_j$ 522. This number of $d_v$ edges (shown as $d_v$ 514) may be referred to as the degree of a variable node i. Analogously, every check node of the M check nodes 520 has exactly $d_c(j)$ edges (shown as $d_c$ 524) connecting this node to one or more of the variable nodes (or bit nodes) 510. This number of edges, $d_c$, may be referred to as the degree of the check node j.

An edge 530 between a variable node $v_i$ (or bit node $b_i$) 512 and check node $c_j$ 522 may be defined by $e=(i, j)$. However, on the other hand, given an edge $e=(i, j)$, the nodes of the edge may alternatively be denoted as by $e=(v(e),c(e))$ (or $e=(b(e), c(e)))$. Alternatively, the edges in the graph correspond to the set elements of H where a set element $h_{j,i}$ indicates that an edge connects a bit (e.g., variable) node i with parity check node j.

Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$); these edges are referred to as bit edges, and the messages corresponding to these bit edges are referred to as bit edge messages.

Given a check node $c_j$, one may define the set of edges emitting from the node $c_j$ by $E_c(j)=\{e|c(e)=j\}$; these edges are referred to as check edges, and the messages corresponding to these check edges are referred to as check edge messages. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as a graph code. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [3] referenced above.

In general, with a graph of an LDPC code, the parameters of an LDPC code can be defined by a degree of distribution, as described within M. Luby et al. in [3] referenced above and also within the following reference [4]:

[4] T. J. Richardson and R. L. Urbanke, "The capacity of low-density parity-check code under message-passing decoding," *IEEE Trans. Inform. Theory*, Vol. 47, No. 2, February 2001, pp. 599-618.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects and/or embodiments of the invention are also operable to accommodate both regular LDPC codes and irregular LDPC codes.

It is also noted that many of the embodiments described herein employ the terminology of "bit node" and "bit edge message", or equivalents thereof. Oftentimes, in the art of LDPC decoding, the "bit node" and "bit edge message" are alternatively referred to as "variable node" and "variable edge message", in that, the bit values (or variable values) are those which are attempted to be estimated. Either terminology can be employed in accordance with certain aspects of the invention.

In accordance with LDPC coding, quasi-cyclic LDPC codes (as described in reference [5]) have become increasingly popular in recent times.

[5] Marc P. C. Fossorier, "Quasi-Cyclic Low-Density Parity-Check Codes From Circulant Permutation Matrices," *IEEE Trans. Inform. Theory*, Vol. 50, No. 8, August 2004, pp. 1788-1793.

A general description of such a quasi-cyclic LDPC code is that each codeword thereof, after undergoing a cyclic shift, will result in another codeword of the LDPC in most cases;

since this is not true necessarily for all codewords of the LDPC code, hence the use of the term "quasi".

Typically, the manner in which such quasi-cycle LDPC codes are constructed in the art is using a brute force approach in which a designer simply tries a large number of variations without any real design methodology. There is no efficient methodology in the prior art by which such quasi-cyclic LDPC codes may be constructed.

Herein, a methodology is presented by which a large number of quasi-cyclic LDPC codes can be constructed in a very efficient manner for comparison and selection of one or more of those LDPC codes to be used in any of a wide variety of communication systems types and communication device types. Any other application context (e.g., including information storage device, etc.) in which ECC may be employed can also use one or more of these LDPC codes.

In addition, the manner presented herein in which LDPC codes may be constructed allows for a designer to compare and employ various sub-matrix sizes of the corresponding LDPC matrices.

FIG. 6 illustrates an embodiment 600 of the relationship between an overall LDPC matrix and the individual sub-matrices therein that include all zero-valued sub-matrices and/or CSI (Cyclic Shifted Identity) sub-matrices.

A binary LDPC code may be fully described by its parity check matrix (i.e., its LDPC matrix). At the top of FIG. 6, the individual elements of an LDPC matrix, H, are shown:

$$H = \begin{bmatrix} h_{0,0} & h_{0,1} & \cdots & h_{0,n-1} \\ h_{1,0} & h_{1,1} & \cdots & h_{1,n-1} \\ \vdots & \vdots & \ddots & \vdots \\ h_{m-1,0} & h_{m-1,1} & \cdots & h_{m-1,n-1} \end{bmatrix}$$

where n is the number of bits in a codeword, m is the number of parity check equations of the LDPC code, and $h_{ij}$ is either 0 or 1. An u-bit vector c is a codeword (i.e., of the LDPC code) if and only if Hc=0.

Because they have been viewed as being easier to implement in hardware, the special type of LDPC codes, known as quasi-cyclic codes (see reference [5] indicated above), has become more prevalent in use. However, as also mentioned above, the manner by which such quasi-cyclic LDPC codes may be constructed can be quite inefficient and burdensome (e.g., a brute force approach).

For such an LDPC code, the parity matrix H is also composed of a number of q-by-q (i.e., q×q) square sub-matrices as shown in the bottom portion of FIG. 6 and also below:

$$H = \begin{bmatrix} S_{0,0} & S_{0,1} & \cdots & S_{0,N-1} \\ S_{1,0} & S_{1,1} & \cdots & S_{1,N-1} \\ \vdots & \vdots & \ddots & \vdots \\ S_{M-1,0} & S_{M-1,1} & \cdots & S_{M-1,N-1} \end{bmatrix} \quad \text{(Equation 1)}$$

where M=m/q, N=n/q, and each sub-matrix, $S_{I,J}$, thereof is a q-by-q sub-matrix that is either an all zero-valued sub-matrix (i.e., in which all elements thereof are the value or zero "0") or a CSI (Cyclic Shifted Identity) sub-matrix. A CSI sub-matrix S is characterized by a shift-value, $\lambda(S)$, such that the components of S are defined as follows:

$$s_{i,j} = \begin{cases} 1 & \text{if } i + \lambda(S) = j(\text{mod } q) \\ 0 & \text{otherwise} \end{cases}$$

for any i and j, with $0 \leq i < q$ and $0 \leq j < q$. For example, the q-by-q identity matrix is itself a CSI matrix with a shift-value $\lambda(S)=0$ (i.e., a CSI sub-matrix that has undergone a cyclic shift of zero "0").

For reference, we define a "masking" matrix $T=[T_{I,J}]$, for any I and J, with $0 \leq I < M$ and $0 \leq J < N$, by $$T_{I,J} = \begin{cases} 0 & \text{if } S_{I,J} \text{ is the zero matrix} \\ 1 & \text{if } S_{I,J} \text{ is a CSI matrix} \end{cases}$$

It is well-known in the art that the performance of an LDPC code suffers significantly if it contains "four-cycles".

Some properties of a quasi-cyclic LDPC code having a four-cycle is described in the following U.S. Utility patent applications that are hereby incorporated herein by reference in their entirety and made part of the present U.S. Utility patent application for all purposes (e.g., also see above):

1. U.S. Utility patent application Ser. No. 11/472,226, entitled "Efficient construction of LDPC (Low Density Parity Check) codes with corresponding parity check matrix having CSI (Cyclic Shifted Identity) sub-matrices,", filed on Jun. 21, 2006, pending.

2. U.S. Utility patent application Ser. No. 11/472,256, entitled "Efficient construction of LDPC (Low Density Parity Check) codes with corresponding parity check matrix having CSI (Cyclic Shifted Identity) sub-matrices,", filed on Jun. 21, 2006, pending.

In these co-pending U.S. utility patent applications 1-2, it is shown that within a quasi-cyclic LDPC code with parity matrix H as described in (Equation 1) above, having a four-cycle is equivalent to the existence of I'≠I" and J'≠J" such that $T_{I',J'} \cdot T_{I',J''} \cdot T_{I'',J'} \cdot T_{I'',J''} = 1$ and $\lambda(S_{I',J'}) - \lambda(S_{I',J''}) + \lambda(S_{I'',J''}) - \lambda(S_{I'',J'}) = 0 (\text{mod } q)$' \quad (Equation 2)

Various methods (for example, see co-pending U.S. utility patent applications 1-2) for constructing quasi-cyclic codes that do not have four-cycles have been proposed by the inventors. Some of those approaches employ the construction of an algebraic code that can guarantee a desired minimum distance between any pair of codewords. Other approaches employ combinatorial searches of acceptable shift-values for each sub-matrix (e.g., cyclic shift values of various CSI sub-matrices).

A manner by which an LDPC matrix of an LDPC code may be constructed is presented below. For efficient and quick generation of LDPC codes without any four-cycles (e.g., within their corresponding bipartite graphs), the cyclic shift value of every non-zero sub-matrix, $S_{I,J}$, of the overall LDPC matrix, H, is performed as follows.

$\lambda(S_{I,J})=f(a_I, b_J)$ where $a_I$ for $0 \leq I < M$ are distinct integers, $b_J$ for $0 \leq J < N$ are distinct integers, and $f$ is a bivariate function.

Case 1 (sub-matrix size, q is prime)

Let q, the size of the sub-matrices of H, be a prime number. Next, define $\lambda(S_{I,J})=f(a_I, b_J)=a_I \cdot b_J(\text{mod } q)$ \quad (Equation 3)

Now, (Equation 2) is satisfied only if $$f(a_{I'}, b_{J'}) - f(a_{I'}, b_{J''}) + f(a_{I''}, b_{J''}) - f(a_{I''}, b_{J'}) = 0 \pmod{q}$$

which implies $$a_{I'} \cdot b_{J'} - a_{I'} \cdot b_{J''} + a_{I''} \cdot b_{J''} - a_{I''} \cdot b_{J'} = 0 \pmod{q}$$

$$a_{I'} \cdot (b_{J'} - b_{J''}) + a_{I''} \cdot (b_{J''} - b_{J'}) = 0 \pmod{q}$$

$$(a_{I'} - a_{I''}) \cdot (b_{J'} - b_{J''}) = 0 \pmod{q} \quad \text{(Equation 4)}$$

However, since q is prime in this embodiment, this (Equation 4) can be satisfied only if $a_{I'} = a_{I''}$ (mod q) or $b_{J'} = b_{J''}$ (mod q).

So, when q is prime, choose any $a_I$ for $0 \leq I < M$ so that they are distinct elements from the set $Z_q = \{0, 1, \ldots, q-1\}$ and any $b_J$ for $0 \leq J < N$ so that they are distinct elements from the same set. Then, if we define the shift-value of each non-zero sub-matrix $S_{I,J}$ by $$\lambda(S_{I,J}) = a_I \cdot b_J \pmod{q} \quad \text{(Equation 5)}$$

then the resultant LDPC code will be guaranteed to have no four-cycles.

Case 2 (sub-matrix size, q, is non-prime)

When q is not prime, then the shift-value of each sub-matrix $S_{I,J}$ is still defined as above in (Equation 3). However, since q is not a prime, there may be distinct values of $a_{I'}$ and $a_{I''}$ with $a_{I'} \neq a_{I''}$ (mod q) and distinct values $b_{J'}$ and $b_{J''}$ with $b_{J'} \neq b_{J''}$ (mod q) such that (Equation 4) is satisfied. As such, there may be embodiments in which the resulting LDPC may undesirably include four cycles. As such, the following construction approach (e.g., shown in various Steps) is employed to ensure that no four cycles exist in the resulting LDPC code.

Step 1. Let A and B be the empty set. Set $\hat{I} = 0$ and $\hat{J} = 0$.
Step 2. Construct V(A), the "avoidance set" of A by
V(A) = {d | d·($a_{I'} - a_{I''}$) = 0 (mod q) for some $a_{I'}$ and $a_{I''}$ in A, $a_{I'} \neq a_{I''}$} and V(B), the "avoidance set" of B by
V(B) = {d | d·($b_{J'} - b_{J''}$) = 0 (mod q) for some $b_{J'}$ and $b_{J''}$ in B, $b_{J'} \neq b_{J''}$}.
Step 3. Either
a. If $\hat{I} < M$, then pick $a_{\hat{I}}$ from the set $Z_q$ such that for all I, $0 \leq I < \hat{I}$, $a_{\hat{I}} \neq a_I$ and both $(a\hat{I} - a_I)$ and $(a_I - a_{\hat{I}})$ are not in V(B). Add $a_{\hat{I}}$ to A and increment $\hat{I}$ by 1.
Or
b. If $\hat{J} < N$, then pick $b_{\hat{J}}$ from the set $Z_q$ such that for all J, $0 \leq J < \hat{J}$, $b_{\hat{J}} \neq b_J$ and both $(b_{\hat{J}} - b_J)$ and $(b_J - b_{\hat{J}})$ are not in V(A). Add $b_{\hat{J}}$ to B and increment $\hat{J}$ by 1.
Or
c. If neither Step 4a nor Step 4b can be carried out, then go back Step 1 and start the algorithm all over.
Step 4. If $\hat{I} \neq M$ or $\hat{J} \neq N$, then go to Step 3. Otherwise, stop since an LDPC code without any "four-cycles" has been generated with $\{a_I | 0 \leq I < M\} = A$ and $\{b_J | 0 \leq J < N\} = B$ and the shift-value of any non-zero sub-matrix $S_{I,J}$ defined by (Equation 5).

The LDPC code construction approach can be simplified further by first generating M elements for A exclusively and then attempting to pick the N elements of B afterward, or vice versa.

It is easy to show that, by construction, for any $a_{I'}$ and $a_{I''}$ in A, with $a_{I'} \neq a_{I''}$, and any $b_{J'}$ and $b_{J''}$, with $b_{J'} \neq b_{J''}$, $$(a_{I'} - a_{I''}) \cdot (b_{J'} - b_{J''}) \neq 0 \pmod{q}.$$

So, if the algorithm terminates with M elements in A and N elements in B, the resulting code is guaranteed to be four-cycle free.

However, depending on the values of q, M, and N, it may not be possible to pick sufficient number of elements for A and/or B. In that case, some of the sub-matrices must be forced to be the q-by-q zero matrix. In that case, use the method described above to generate as many elements for A and B as possible. Afterward, continue on with the following additional steps:

Step 5. Let A' and B' be the empty set. Set $\hat{I} = |A|$ and $\hat{J} = |B|$.
Step 6. Either
a. If $\hat{I} < M$, then pick $a_{\hat{I}}$ from the set $Z_q$ such that for any I, with $0 \leq I < \hat{I}$, and for any J' and J", with $0 \leq J' < J'' < \hat{J}$, $$T_{I,J'} \cdot T_{I,J''} \cdot T_{\hat{I},J'} \cdot T_{\hat{I},J''} = 1 \Rightarrow (a_I - a_{\hat{I}}) \cdot (b_{J'} - b_{J''}) \neq 0 \pmod{q}.$$

Add $a_{\hat{I}}$ to A' and increment $\hat{I}$ by 1.
Or
b. If $\hat{J} < N$, then pick $b_{\hat{J}}$ from the set $Z_q$ such that for any J, with $0 \leq J < \hat{J}$, and for any I' and I", with $0 \leq I' < I'' < \hat{I}$, $$T_{I',J} \cdot T_{I'',J} \cdot T_{I',\hat{J}} \cdot T_{I'',\hat{J}} = 1 \Rightarrow (a_{I'} - a_{I''}) \cdot (b_J - b_{\hat{J}}) \neq 0 \pmod{q}.$$

Add $b_{\hat{J}}$ to B' and increment $\hat{J}$ by 1.
Or
c. If neither Step 6a nor Step 6b can be carried out, then either choose a new set of values for $T_{I,J}$ or go back to Step 1 or Step 5.
Step 7. If $\hat{I} \neq M$ or $\hat{J} \neq N$, go to Step 6. Otherwise, stop since an LDPC code without any "four-cycles" has been generated with $\{a_I | 0 \leq I < M\} = A \cup A'$ and $\{b_J | 0 \leq J < N\} = B \cup B'$ and the shift-value of any non-zero sub-matrix $S_{I,J}$ defined by (equation 5).

It is noted that, depending on the application, the masking matrix T can be defined in advance and remains constant or it may be modified as necessary depending on choices of $a_{\hat{I}}$ and $b_{\hat{J}}$ in Step 6 above.

Case 3

Let $q = p^m - 1$, the size of the sub-matrices of H with p being a prime number. Next, define the cyclic shift of a sub-matrices as follows:

$$\lambda(S_{I,J}) = f(a_I, b_J) = \log_{p^m}\{[v(a_I u - b_J)] \pmod{q}\}$$

where the values, u, v in $\{0, 1, \ldots, q-1\}$ and $a_I$, $b_J$ can be considered as elements in a finite field in $GF(p^m)$. The elements of that field can be represented as $\alpha^n$ for $n = 0, 1, \ldots, q-1$, where $\alpha$ is a primitive element of the finite field. Then the logarithm of an element $\alpha^n$ is n, and the multiplication can be considered as product in the filed.

This construction is equivalent to one of the construction methods in the U.S. utility patent applications 1-2 incorporated by reference above where a Generalized Reed-Solomon (GRS) code is used to define the LDPC matrix, H.

Figure 7:
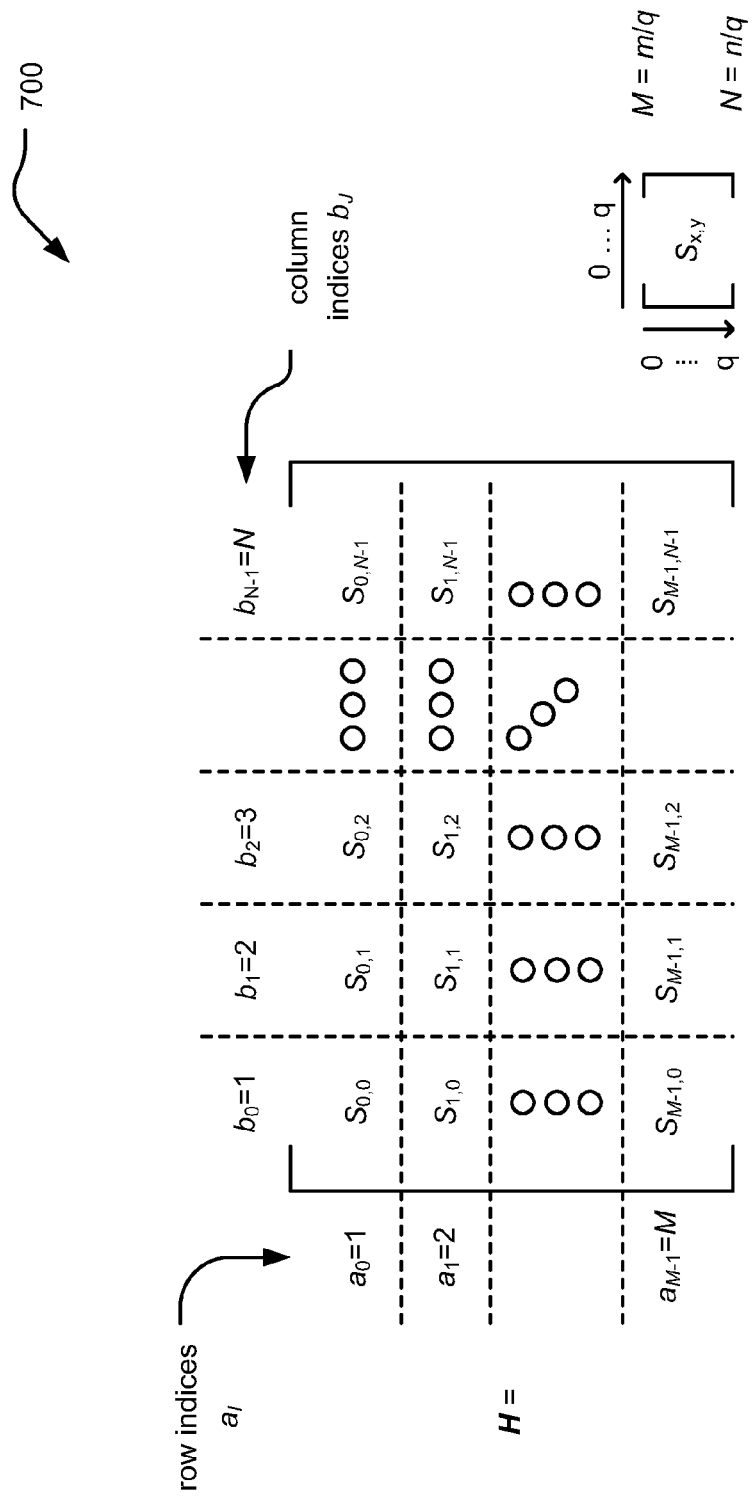
FIG. 7 illustrates an embodiment showing the correspondence between sub-matrix size, row index, column index, and cyclic shifting as performed for CSI sub-matrices within an LDPC matrix.

FIG. 7 illustrates an embodiment 700 showing the correspondence between sub-matrix size, row index, column index, and cyclic shifting as performed for CSI sub-matrices within an LDPC matrix.

As can be seen, a row index and a column index correspond to the location of each respective sub-matrix within the LDPC matrix, H. In this embodiment, the row indices are shown as varying from 1 to M, and the column indices are shown as varying from 1 to N.

The cyclic shift for any sub-matrix is provided by the (Equation 3) above, which is as follows:

$$\lambda(S_{I,J}) = f(a_I, b_J) = a_I \cdot b_J \pmod{q}$$

Considering a concrete example in which the sub-matrix size, q, is 5, then the cyclic shift of the sub-matrix, $S_{1,2}$, is calculated as follows:

$$\lambda(S_{1,2}) = f(a_1, b_2) = 2 \cdot 3 \pmod{5} = 1$$

Again, as described above, there may be situations where the sub-matrix size is not a prime value, and the use of an avoidance set and/or the replacing of at least one CSI sub-matrix with an all zero-valued sub-matrix may be performed to ensure that no four cycles exit within the resulting LDPC code.

Figure 8:
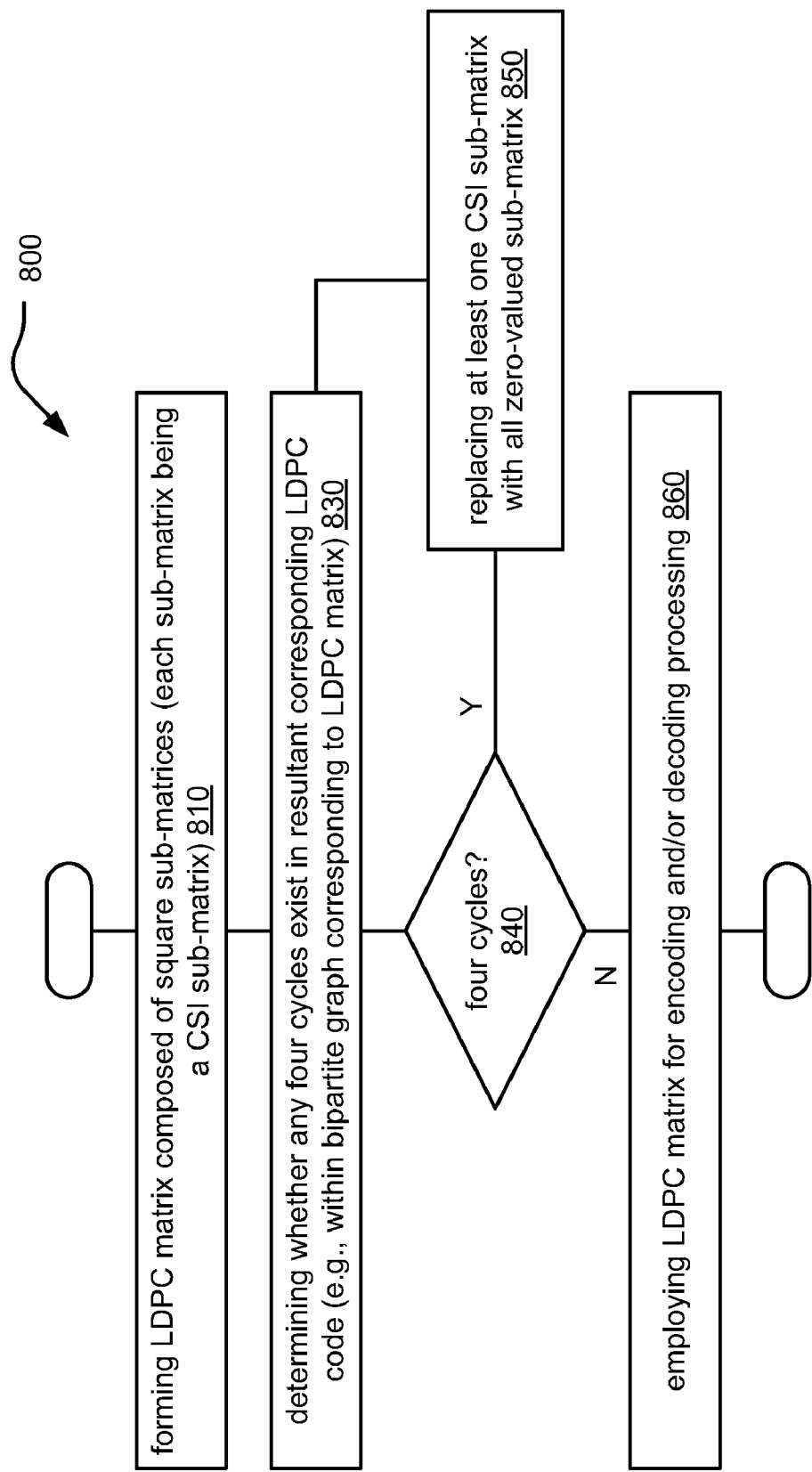
FIG. 8 illustrates an embodiment of a method for LDPC code construction and for performing encoding and/or decoding processing using that LDPC code.

FIG. 8 illustrates an embodiment of a method for LDPC code construction and for performing encoding and/or decoding processing using that LDPC code. The method 800 begins as shown in block 810 by forming an LDPC matrix composed of square sub-matrices. Each of these sub-matrices is initially a CSI sub-matrix.

Then, as shown in a block 830, the method continues by determining whether any four cycles exist in the resultant corresponding LDPC code (e.g., within the bipartite graph corresponding to the LDPC matrix of that LDPC code).

If any four cycles do exist in the LDPC code, then decision block 840 directs the method 800 to operate by replacing at least one CSI sub-matrices with an all zero-valued sub-matrix (i.e., a sub-matrix in which all of the elements therein have a value of zero "0"). The method 800 then operates using block 830 by determining whether any four cycles exist in the resultant corresponding LDPC code of this now-updated LDPC code (i.e., in which at least one sub-matrix has been replaced).

However, if no four cycles exist in any LDPC code generated in any iteration, then decision block 840 directs the method 800 to operate by employing the LDPC matrix for encoding and/or decoding processing within a communication system and/or communication device, as shown in block 860.

Figure 9:
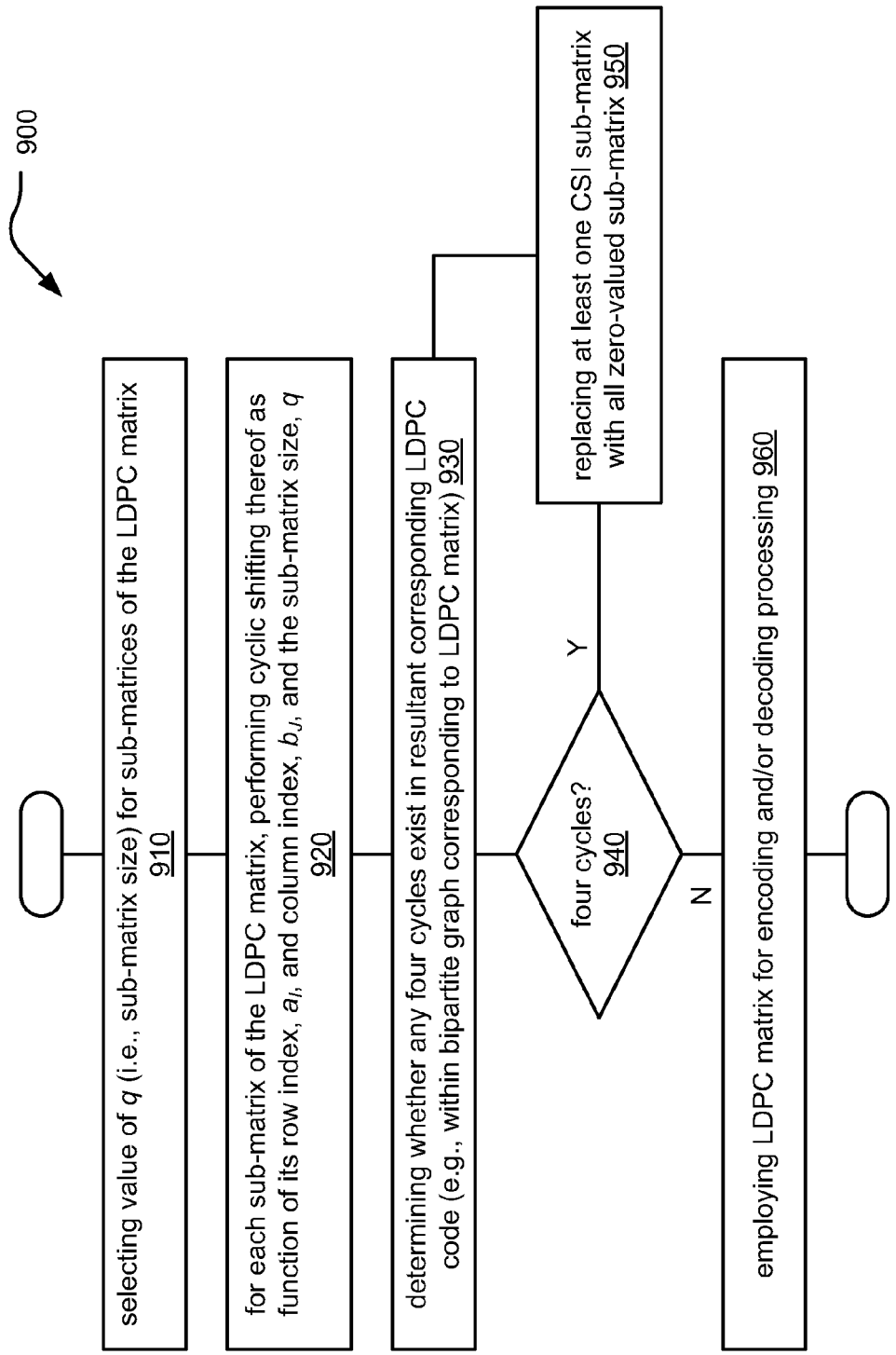
FIG. 9 illustrates an alternative embodiment of a method for LDPC code construction and for performing encoding and/or decoding processing using that LDPC code.

FIG. 9 illustrates an alternative embodiment of a method 900 for LDPC code construction and for performing encoding and/or decoding processing using that LDPC code. This embodiment is somewhat analogous to the previous embodiment.

The method 900 begins as shown in block 910 by selecting a value of q (i.e., sub-matrix size) for the sub-matrices of the LDPC matrix to be formed. For each sub-matrix of the LDPC matrix, the method 900 operates by performing cyclic shifting thereof as a function of its row index, $a_f$, its column index, $b_J$, and also as a function of the sub-matrix size, q, of the sub-matrices employed within the LDPC matrix (e.g., by using (Equation 3) as referenced above).

Then, as shown in a block 930, the method continues by determining whether any four cycles exist in the resultant corresponding LDPC code (e.g., within the bipartite graph corresponding to the LDPC matrix of that LDPC code).

If any four cycles do exist in the LDPC code, then decision block 940 directs the method 900 to operate by replacing at least one CSI sub-matrices with an all zero-valued sub-matrix (i.e., a sub-matrix in which all of the elements therein have a value of zero "0"). The method 900 then operates using block 930 by determining whether any four cycles exist in the resultant corresponding LDPC code of this now-updated LDPC code (i.e., in which at least one sub-matrix has been replaced).

However, if no four cycles exist in any LDPC code generated in any iteration, then decision block 940 directs the method 900 to operate by employing the LDPC matrix for encoding and/or decoding processing within a communication system and/or communication device, as shown in block 960.

Figure 10:
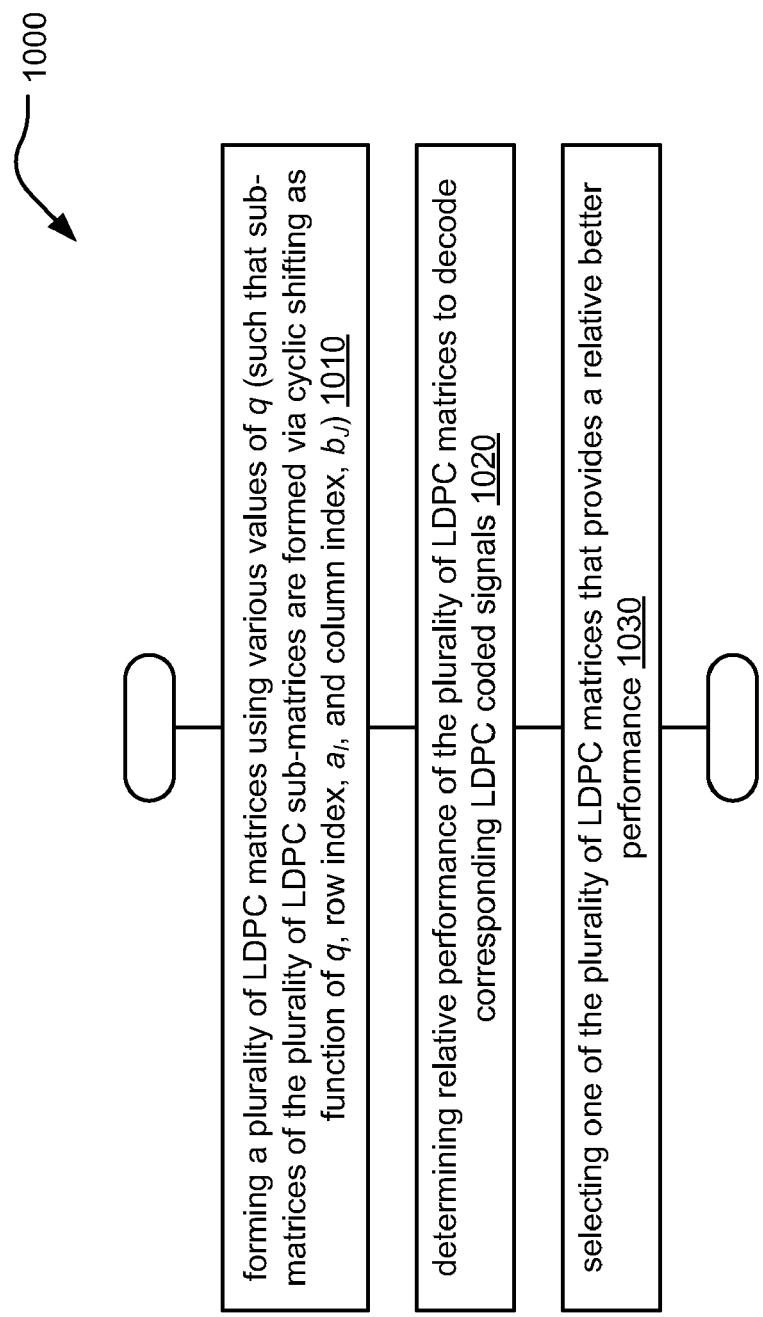

FIG. 10 illustrates an embodiment of a method 1000 for construction of multiple LDPC codes and performing comparison thereof to select at least one LDPC code there from. The method 1000 operates by forming a plurality of LDPC matrices using various values of q (i.e., the sub-matrix size) as shown in block 1010. This is performed such that the sub-matrices of the LDPC matrix are formed via cyclic shifting as a function of q, row index, $a_f$, and column index, $b_J$, in accordance with the approaches presented herein.

Then, the method 1000 operates by determining the relative performance of the plurality of LDPC matrices to decode corresponding LDPC coded signals, as shown in block 1020. For example, this can involve performing various simulations using each of the various LDPC codes to see how well they perform with respect to one another (e.g., Eb/No vs. SNR, error rates, etc.).

As shown in block 1030, the method 1000 operates by selecting one (or more) of the plurality of LDPC matrices generated that provides a relative better performance than the others. The method 1000 may then also employ the selected one or more LDPC matrices in any desired communication system and/or communication device.

Figure 11:
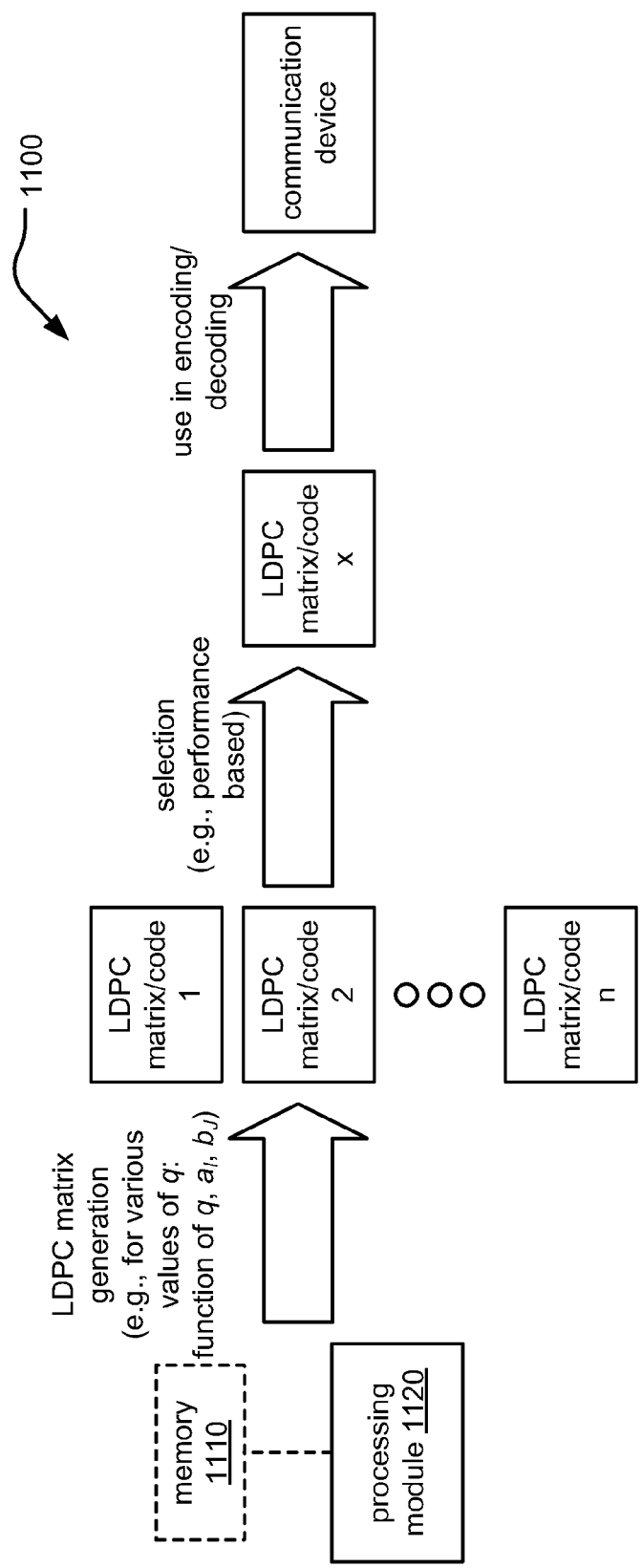
FIG. 11 illustrates an embodiment of functionality of LDPC code construction and the resulting implementation thereof for use in a communication device.

FIG. 11 illustrates an embodiment of functionality 1100 of LDPC code construction and the resulting implementation thereof for use in a communication device. In this embodiment, a processing module 1120 and memory 1110 (which be externally coupled to the processing module 1120 or integrated therein) operate together. The memory 1110, coupled to the processing module 1120, is operable to store operational instructions that enable the processing module to form a plurality of LDPC (Low Density Parity Check) matrices for various values of q (e.g., sub-matrix size), row index, $a_f$, and column index, $b_J$, etc. These various LDPC codes/matrices are shown as LDPC matrix/code 1, LDPC matrix/code 2, . . . , and LDPC matrix/code n.

The processing module 1120 then determines the relative performance of the plurality of LDPC matrices to decode corresponding LDPC coded signals. The processing module 1120 then selects one (or more) of the plurality of LDPC matrices that provides a relatively relative a better performance (e.g., shown generally as LDPC matrix/code x), and this LDPC matrix/code x is shown as being employed by a communication device in encoding and/or decoding processing.

Figure 12:
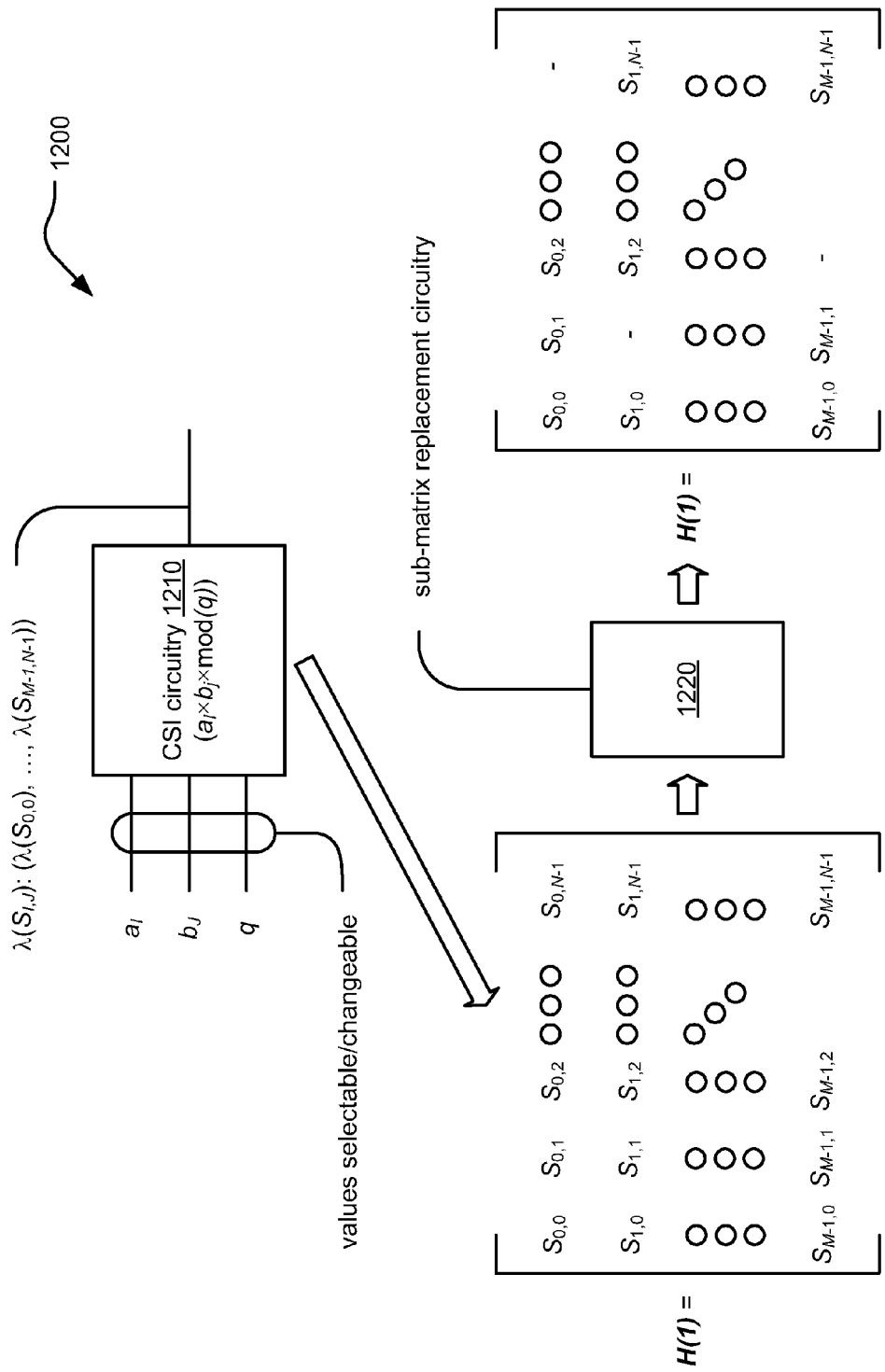
FIG. 12 illustrates an embodiment of a CSI circuitry that is operable to generate various sub-matrices for use in generating an LDPC matrix that may be employed within a communication device.

FIG. 12 illustrates an embodiment 1200 of a CSI circuitry 1210 that is operative to generate various sub-matrices for use in generating an LDPC matrix that may be employed within a communication device. Based on various inputs provided to the CSI circuitry 1210, shown as being values of $a_f$, $b_J$, and q. These values may be changes and selected to be different values for generating at lest two different sub-matrices within an LDPC matrix.

Based on these inputs, the CSI of a particular sub-matrix is generated as $a_f \times b_J \times \mod(q)$, where mod is the modulo operator. In some embodiments, all sub-matrices of an LDPC matrix are generated using the CSI circuitry 1210 for different, respective input values (e.g., first sub-matrix using $a_1$, $b_1$, and q, second sub-matrix using $a_1$, $b_2$, and q, and so on).

After a first LDPC matrix is formed, then the first LDPC matrix (shown as H(1)) may be modified, using a sub-matrix replacement circuitry 1220, to generate a second LDPC matrix (shown as H(2)) by the use of an avoidance set and/or the replacing of at least one CSI sub-matrix with an all zero-valued sub-matrix to ensure that no four cycles exit within the resulting LDPC code (an an all zero-valued sub-matrix is shown as "-"). This second LDPC matrix (shown as H(2)) may then be employed by a communication device in accordance with encoding and/or decoding.

In some embodiments, the CSI circuitry 1210 is connected to the sub-matrix replacement circuitry 1220, and the sub-matrix replacement circuitry 1220 is connected to one or both of an LDPC encoder circuitry or an LDPC decoder circuitry (or to an LDPC circuitry capable of performing both encoding and decoding) such that the LDPC encoder circuitry, the LDPC decoder circuitry, or the LDPC circuitry capable of performing both encoding and decoding then is operative to employ the second LDPC matrix (shown as H(2)) for using in with encoding at least one information bit thereby generating an LDPC codeword and/or decoding a signal to make an estimate of at least one information bit encoded therein.

It is noted that the various modules (e.g., encoding modules, decoding modules, processing modules, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. An apparatus, comprising:
an LDPC (Low Density Parity Check) decoder circuitry that employs an LDPC matrix to decode an LDPC coded signal thereby generating an estimate of an information bit encoded therein; and wherein:
the LDPC matrix is composed of a plurality of square sub-matrices of size q×q, each sub-matrix having a corresponding row index, $a_I$, and corresponding column index, $b_J$, such that q, and each value of $a_I$ and $b_J$ is an integer; and
at least some of the plurality of square sub-matrices are CSI (Cyclic Shifted Identity) sub-matrices having undergone a cyclic shift of the function: $a_I \times b_J \times \mod(q)$, where mod is the modulo operator.

2. The apparatus of claim 1, wherein:
a bipartite graph corresponding to the LDPC matrix includes, if any, only cycles that are greater than 4.

3. The apparatus of claim 1, wherein:
at least one of the plurality of square sub-matrices is an all zero-valued sub-matrix.

4. The apparatus of claim 3, wherein:
q is a non-prime number.

5. The apparatus of claim 1, wherein:
at least one of the plurality of square sub-matrices is an identity sub-matrix or a CSI sub-matrix having undergone a cyclic shift of 0.

6. The apparatus of claim 1, wherein:
the LDPC matrix corresponds to a quasi-cyclic LDPC code.

7. The apparatus of claim 1, further comprising:
a CSI circuitry that is operative to generate the plurality of square sub-matrices based on each respective and corresponding row index, $a_I$, each respective and corresponding column index, $b_J$, and q; and
a sub-matrix replacement circuitry that is operative to replace at least one of the plurality of square sub-matrices with an all-zero valued sub-matrix.

8. The apparatus of claim 1, wherein:
the apparatus is a wireless, personal communication device.

9. The apparatus of claim 1, wherein:
the apparatus is a communication device; and
the communication device is a receiver or a transceiver.

10. The apparatus of claim 1, wherein:
the apparatus is a communication device; and
the communication device is implemented within at least one of a satellite communication system, a wireless communication system, a wired communication system, and a fiber-optic communication system.

11. A method, comprising:
forming a first LDPC (Low Density Parity Check) matrix composed of a plurality of square sub-matrices of size q×q, each sub-matrix having a corresponding row index, $a_I$, and corresponding column index, $b_J$, such that q, and each value of $a_I$ and $b_J$ is an integer;
when forming at least one of the plurality of square sub-matrices of the first LDPC matrix, employing a CSI (Cyclic Shifted Identity) circuitry to perform cyclic shifting on a plurality of identity sub-matrices thereby forming a plurality of CSI sub-matrices such that each CSI sub-matrix undergoes a cyclic shift of the function: $a_I \times b_J \times \mod(q)$, where mod is the modulo operator;
when a bipartite graph of the first LDPC matrix includes a cycle equal to 4, replacing at least one of the plurality of CSI sub-matrices with an all zero-valued sub-matrix thereby generating a second LDPC matrix; and employing the first LDPC matrix or the second LDPC matrix to decode an LDPC coded signal thereby generating an estimate of an information bit encoded therein.

12. The method of claim 11, wherein:
at least one of the plurality of square sub-matrices is an identity sub-matrix or a CSI sub-matrix having undergone a cyclic shift of 0.

13. The method of claim 11, wherein:
at least one of the first LDPC matrix and the second LDPC matrix corresponds to a quasi-cyclic LDPC code.

14. The method of claim 1, wherein:
the method is performed within a communication device; and
the communication device is implemented within at least one of a satellite communication system, a wireless communication system, a wired communication system, and a fiber-optic communication system.

15. An apparatus, comprising:
a processing module; and
a memory, coupled to the processing module, that is operable to store operational instructions that enable the processing module to:
form a plurality of LDPC (Low Density Parity Check) matrices;
determine relative performance of the plurality of LDPC matrices to decode corresponding LDPC coded signals; and
select one of the plurality of LDPC matrices that provides a relatively better performance; and wherein:
a first of the LDPC matrices is composed of a first plurality of square sub-matrices of size $q(1) \times q(1)$, each sub-matrix having a corresponding row index, $a_i(1)$, and corresponding column index, $b_j(1)$, such that $q(1)$, and each value of $a_i(1)$ and $b_j(1)$ is an integer;
and at least some of the first plurality of square sub-matrices are CSI (Cyclic Shifted Identity) sub-matrices having undergone a cyclic shift of the function: $a_i(1) \times b_j(1) \times \mathrm{mod}(q(1))$, where mod is the modulo operator;
a second of the LDPC matrices is composed of a second plurality of square sub-matrices of size $q(2) \times q(2)$, each sub-matrix having a corresponding row index, $a_i(2)$, and corresponding column index, $b_j(2)$, such that $q(2)$, and each value of $a_i(2)$ and $b_j(2)$ is an integer; and
and at least some of the second plurality of square sub-matrices are CSI sub-matrices having undergone a cyclic shift of the function: $a_i(2) \times b_j(2) \times \mathrm{mod}(q(2))$.

16. The apparatus of claim 15, wherein:
a bipartite graph corresponding to at least one of the LDPC matrices includes, if any, only cycles that are greater than 4.

17. The apparatus of claim 15, wherein:
at least one of the first plurality of square sub-matrices and the second plurality of square sub-matrices is an all zero-valued sub-matrix.

18. The apparatus of claim 15, wherein:
at least one of the first plurality of square sub-matrices and the second plurality of square sub-matrices is an identity sub-matrix or a CSI sub-matrix having undergone a cyclic shift of 0.

19. The apparatus of claim 15, wherein:
at least one of the first LDPC matrix and the second LDPC matrix corresponds to a quasi-cyclic LDPC code.

20. The apparatus of claim 15, wherein:
the apparatus is a communication device; and
the communication device is implemented within at least one of a satellite communication system, a wireless communication system, a wired communication system, and a fiber-optic communication system.

* * * * *